United States Patent
Zhu

(10) Patent No.: US 10,134,862 B2
(45) Date of Patent: Nov. 20, 2018

(54) SEMICONDUCTOR DEVICE CONTAINING FIN AND BACK GATE AND METHOD FOR MANUFACTURING THE SAME

(71) Applicant: Huilong Zhu, Poughkeepsie, NY (US)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/389,194

(22) PCT Filed: Mar. 19, 2013

(86) PCT No.: PCT/CN2013/072856
§ 371 (c)(1),
(2) Date: Sep. 29, 2014

(87) PCT Pub. No.: WO2014/121544
PCT Pub. Date: Aug. 14, 2014

(65) Prior Publication Data
US 2015/0084127 A1 Mar. 26, 2015

(30) Foreign Application Priority Data
Feb. 8, 2013 (CN) .......................... 2013 1 0050123

(51) Int. Cl.
*H01L 29/423* (2006.01)
*H01L 29/66* (2006.01)
(Continued)

(52) U.S. Cl.
CPC .. *H01L 29/42384* (2013.01); *H01L 29/66537* (2013.01); *H01L 29/66795* (2013.01);
(Continued)

(58) Field of Classification Search
CPC ............. H01L 29/785; H01L 29/42384; H01L 29/66795
See application file for complete search history.

(56) References Cited

U.S. PATENT DOCUMENTS

| | | | |
|---|---|---|---|
| 2004/0036127 A1* | 2/2004 | Chau | B82Y 10/00 257/401 |
| 2005/0073005 A1 | 4/2005 | Nowak et al. | |

(Continued)

FOREIGN PATENT DOCUMENTS

CN        1913162 A        2/2007

OTHER PUBLICATIONS

Hisamoto, Digh, et al., "FinFET—A Self-Aligned Double-Gate MOSFET Scalable to 20 nm," *IEEE Transactions on Electron Devices*, vol. 47, No. 12, pp. 2320-2325 (Dec. 2000).

(Continued)

*Primary Examiner* — Thao X Le
*Assistant Examiner* — Laura Dykes
(74) *Attorney, Agent, or Firm* — Christensen, Fonder, Dardi & Herbert PLLC

(57) ABSTRACT

High integrity, lower power consuming semiconductor devices and methods for manufacturing the same. The semiconductor device includes: semiconductor substrate; a well region in the semiconductor substrate; an interlayer structure over the well region, the interlayer structure including a back gate conductor, semiconductor fins at both sides of the back gate conductor and respective back gate dielectric isolating the back gate conductor from the semiconductor fins, respectively, wherein the well region functions as one portion of a conductive path of the back gate conductor; a punch-through stop layer at a lower portion of the semiconductor fin; a front gate stack intersecting the semiconductor fin, the front gate stack including a front gate dielectric and a front gate conductor and the front gate dielectric isolating the front gate conductor from the semiconductor fin; and a source region and a drain region connected to a channel region provided by the semiconductor fin.

23 Claims, 18 Drawing Sheets

(51) Int. Cl.
*H01L 29/78* (2006.01)
*H01L 21/265* (2006.01)

(52) U.S. Cl.
CPC ...... *H01L 29/7843* (2013.01); *H01L 29/7848* (2013.01); *H01L 29/7855* (2013.01); *H01L 29/7856* (2013.01); *H01L 21/2652* (2013.01); *H01L 29/66545* (2013.01)

(56) References Cited

U.S. PATENT DOCUMENTS

| | | | |
|---|---|---|---|
| 2006/0240610 | A1 | 10/2006 | Nowak et al. |
| 2007/0235818 | A1* | 10/2007 | Anderson et al. ............ 257/401 |
| 2008/0203491 | A1* | 8/2008 | Anderson ......... H01L 29/66795 257/372 |
| 2009/0108351 | A1 | 4/2009 | Yang et al. |
| 2011/0169101 | A1* | 7/2011 | Doornbos et al. ............ 257/394 |
| 2011/0291188 | A1 | 12/2011 | Cheng et al. |

OTHER PUBLICATIONS

Office Action issued in China and its English Translation, Patent Application No. 201310050123.1, dated Apr. 20, 2016, 15 pgs.

* cited by examiner

SEMICONDUCTOR DEVICE CONTAINING FIN AND BACK GATE AND METHOD FOR MANUFACTURING THE SAME

CROSS-REFERENCE TO RELATED APPLICATION(S)

This application is a National Phase application of United States, and claims priority to, PCT Application No. PCT/CN2013/072856, filed on Mar. 19, 2013, entitled "SEMICONDUCTOR DEVICE AND METHOD FOR MANUFACTURING THE SAME", which claims priority to the Chinese Patent Application No. 201310050123.1, filed on Feb. 8, 2013, entitled "SEMICONDUCTOR DEVICE AND METHOD FOR MANUFACTURING THE SAME". Both the PCT Application and Chinese Application are incorporated herein by reference in their entireties.

TECHNICAL FIELD

The present disclosure relates to semiconductor designs and manufacturing techniques, and particularly, to semiconductor devices containing a fin and methods of manufacturing the same.

BACKGROUND

With the development of semiconductor designs and manufacturing techniques, it is desired to decrease power consumption while reducing the size of a semiconductor device to improve the integration level. In order to suppress a short channel effect caused by a shrinkage of size, a FinFET formed on a SOI wafer or a bulk semiconductor substrate has been proposed. The FinFET may comprise a channel region formed between the fins of semiconductor material and source/drain regions formed in both ends of the fin. A gate electrode at least surrounds the channel region at both sides of the channel regions (i.e. a dual-gate structure) so as to form an inversion layer at the respective sides of the channel. Since the whole channel region is controlled by the gate, it plays a role of suppressing the short channel effect. In order to decrease power consumption caused by leakage, an ultra-thin buried oxide body (UTTB) type FET formed in a semiconductor substrate has been proposed. The UTTB-type FET may comprise an ultra-thin buried oxide layer in the semiconductor substrate, a front gate and source/drain region over the ultra-thin buried oxide layer and a back gate below the ultra-thin buried oxide layer. In operation, power consumption may be remarkably reduced while speed is kept constant by applying a bias voltage to the back gate.

Although there are respective advantages for both solutions, a semiconductor device which incorporates advantages of both solutions has not been proposed, since it is difficult to form a back gate in a FinFET. In a FinFET based on a bulk semiconductor substrate, since the contact surface area of the semiconductor Fin and the semiconductor substrate is very small, the formed back gate will lead to a serious spontaneous heating effect. In a FinFET based on an SOI wafer, the expensive price of the SOI wafer leads to a problem of high cost. In addition, it needs precisely controlled ion implantation when a back gate is formed in the SOI wafer so as to form an implantation region for the back gate below the buried insulation layer and penetrating through the top semiconductor layer, which leads to difficulty of process to make a lower rate of finished products. The unintended doping for the channel region leads to fluctuating of device performance.

SUMMARY

The object of the present disclosure is to provide a semiconductor device and a method for manufacturing the same by utilizing a fin and a back gate to improve performance.

In an aspect of the present disclosure, a semiconductor device is provided, comprising: a semiconductor substrate; a well region in the semiconductor substrate; an interlayer structure over the well region, the interlayer structure including a back gate conductor, semiconductor fins at both sides of the back gate conductor and respective back gate dielectric isolating the back gate conductor from the semiconductor fins, respectively, wherein the well region functioning as one portion of a conductive path of the back gate conductor; a punch-through stop layer at a lower portion of the semiconductor fin; a front gate stack intersecting the semiconductor fin, the front gate stack including a front gate dielectric and a front gate conductor, and the front gate dielectric isolating the front gate conductor from the semiconductor fin; and a source region and a drain region connected to a channel region provided by the semiconductor fin.

In an aspect of the present disclosure, a method for manufacturing a semiconductor device is provided, comprising: forming a well region in a semiconductor substrate so that the portion of the semiconductor substrate over the well region forms a semiconductor layer; forming an interlayer structure over the well region, the interlayer structure including a back gate conductor, semiconductor fins formed by the semiconductor layer at both sides of the back gate conductor, and respective back gate dielectric isolating the back gate conductor from the semiconductor fins, respectively, wherein the well region functioning as one portion of a conductive path of the back gate conductor; forming a punch-through stop layer at lower portion of the semiconductor fin; forming a front gate stack intersecting the semiconductor fin, the front gate stack including a front gate dielectric and a front gate conductor, and the front gate dielectric isolating the front gate conductor from the semiconductor fin; and forming a source region and a drain region connected to a channel region provided by the semiconductor fin.

The semiconductor device of the present disclosure comprises back gate conductors adjacent to the respective sides of the two semiconductor fins. Since the back gate conductor is not formed below the semiconductor fin, it may independently determine contact surface area between the back gate conductor and the well region functioning as one portion of the conductive path according to actual requirement, so as to avoid a spontaneous heating effect generated by the back gate conductor. Furthermore, since it is not necessary to perform an ion implantation penetrating through the semiconductor fin, a fluctuation in the performance of the device caused by unintended doping in the channel region may be avoided.

The semiconductor device incorporates advantages of the FinFET and the UTBB type FET. On one hand, it utilizes the back gate conductor to control or dynamically adjust a threshold voltage of the semiconductor device so as to significantly reduce power consumption while keeping the speed constant; and on the other hand, it utilizes the Fin to suppress the short channel effect so as to maintain the performance of the semiconductor device while scaling down the semiconductor device. Thus, such a semiconductor device may reduce the power consumption while reducing the size of the semiconductor device to increase the integrity level. In addition, the method for manufacturing such a semiconductor device is compatible to the existing semiconductor process, so the cost for manufacturing is lower.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
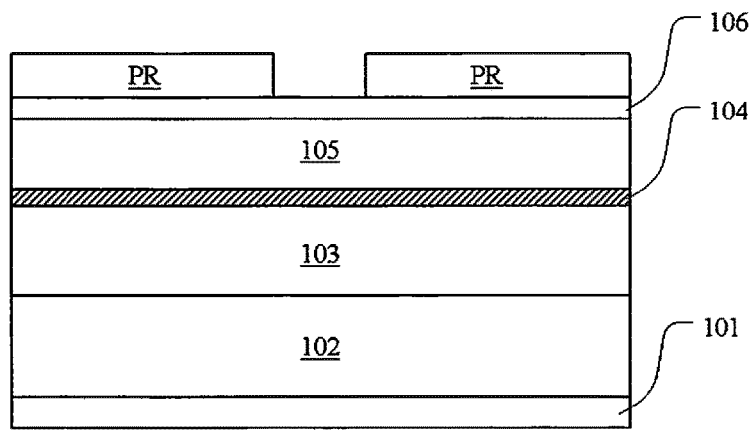
FIG. 1-FIG. 15 show schematic views of the semiconductor structure in various stages of the method for manufacturing a semiconductor device according to one embodiment of the present disclosure.

Exemplary embodiments of the present disclosure will be described in more details below with reference to the accompanying drawings. In the respective drawings, like reference numerals denote like members. The figures are not drawn to scale, for the sake of clarity.

For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

When one layer is referred to as being "directly on" or "on and adjacent to" or "adjoin" another layer or region, there are not intervening layers or regions present.

In the present application, the phrase "semiconductor structure" means generally the whole semiconductor structure formed at each step of the method for manufacturing the semiconductor device, including all of the layers and regions having been formed. Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in, a specific implementation of the disclosure.

Unless the context clearly indicates otherwise, each part of the FinFET can be made of material(s) well known to one skilled person in the art. A semiconductor substrate and a semiconductor layer may be made of any semiconductive material, such as a group III-V semiconductor, for example, GaAs, InP, GaN, or SiC, or a group IV semiconductor, for example, Si or Ge. A gate conductor may be made of any conductive material, such as metal, doped polysilicon, and a stack of metal and doped polysilicon, among others. For example, the gate conductor may be made of one selected from a group consisting of TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, W, HfRu, RuOx, and their combinations. A gate dielectric is made of $SiO_2$ or other dielectric insulation material which has a dielectric constant larger than that of $SiO_2$, such as an oxide, a nitride, an oxynitride, a silicate, an aluminate, and a titanate. The oxide includes, for example, $SiO_2$, $HfO_2$, $ZrO_2$, $Al_2O_3$, $TiO_2$, $La_2O_3$. The nitride includes, for example, $Si_3N_4$. The silicate includes, for example, HfSiOx. The aluminate includes, for example, $LaAlO_3$. The titanate includes for example $SrTiO_3$. The oxynitride includes, for example, SiON. Moreover, the gate dielectric layer may be made of those developed in the future, besides the above known materials.

The present invention may be presented in various forms, some of which will be illustrated in the following.

Figure 14:
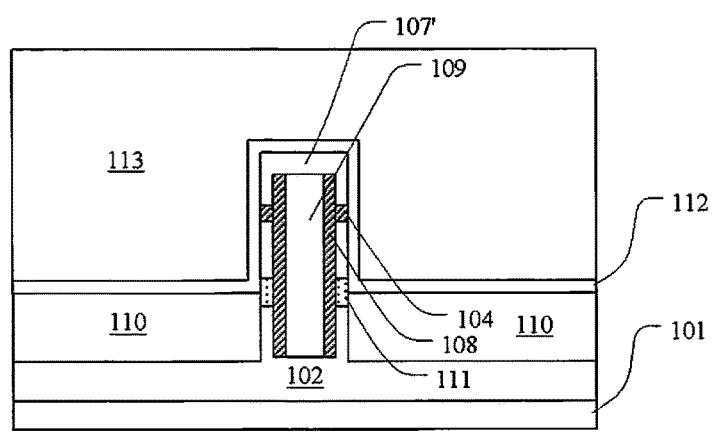
Figure 15A:
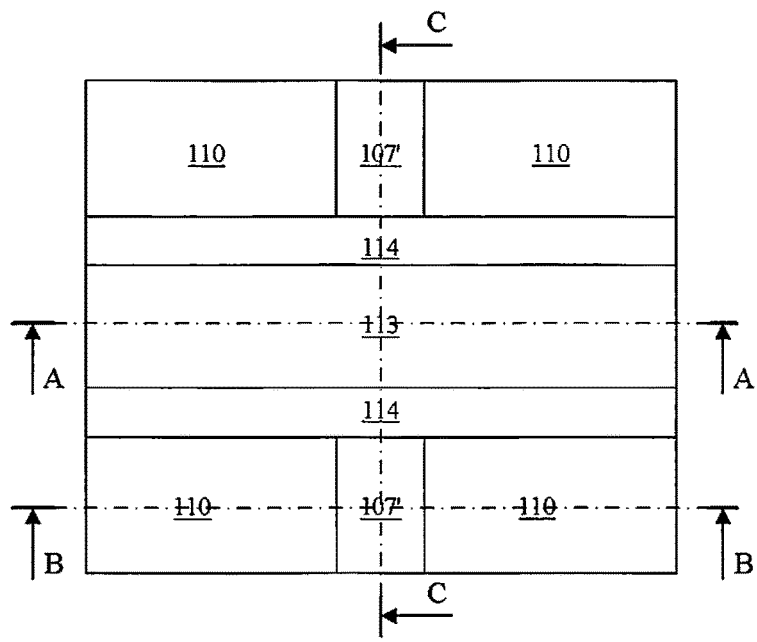
Figure 15B:
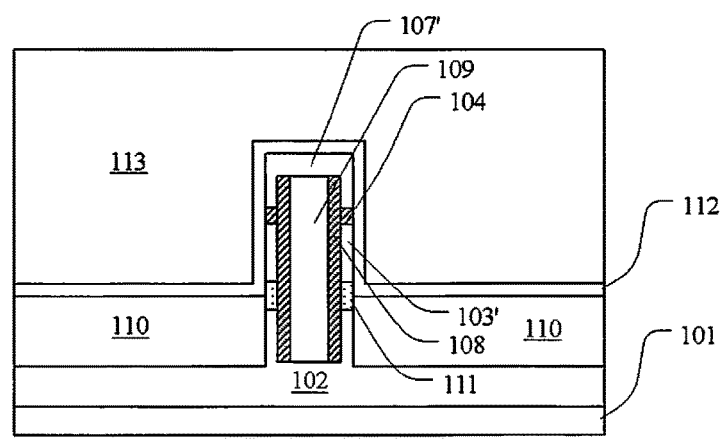
Figure 15C:
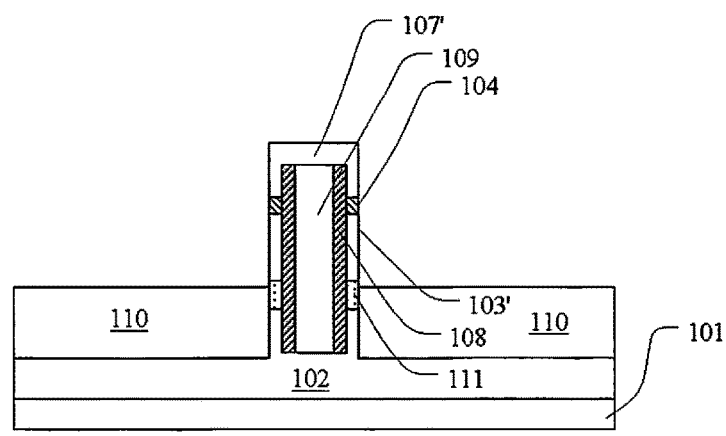
Figure 15D:
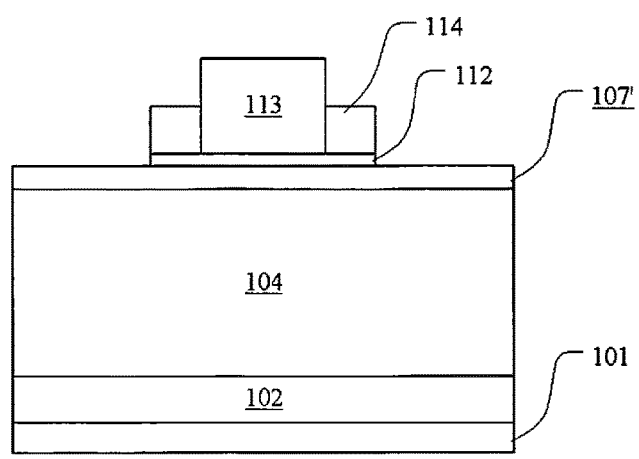

An exemplified flow chart of the method for manufacturing a semiconductor device according to one embodiment of the present disclosure is illustrated by referring to FIG. 1-FIG. 15, in which FIG. 15a shows a top view of the semiconductor structure and position for the sectional view; FIGS. 1-14 and FIG. 15b show the sectional view of the semiconductor structure along a line A-A in the width direction of the semiconductor fin; FIG. 15c shows the sectional view of the semiconductor structure along a line B-B in the width direction of the semiconductor fin; and FIG. 15d shows the sectional view of the semiconductor structure along a line C-C in the length direction of the semiconductor fin.

The method starts from a bulk semiconductor substrate 101. A well region 102 is formed in the bulk semiconductor substrate 101 so that one portion of the semiconductor substrate 101 over the well region 102 forms a semiconductor layer 103 and the well region 102 isolates the semiconductor 103 from the semiconductor substrate 101. The process for forming the well region 102 in the semiconductor substrate 101 is known. For example, an ion implantation is utilized to form a doping region in the semiconductor layer and then annealing is implemented to activate the dopant in the doping region. An N-type well region 102 is formed for a P-type FET and a P-type well region 102 is formed for an N-type FET. Furthermore, a first mask layer 104, a second mask layer 105 and a third mask layer are formed in turn on the semiconductor layer 103 by a known deposition process, such as EBM (Electron Beam Evaporation), CVD (Chemical Vapor Deposition), ALD (Atomic Layer Deposition), sputtering and the like. Then, for example, a photoresist layer (PR) is formed on the third mask layer 106 by spin coating, and the photoresist layer PR is formed to be a pattern for defining the back gate (for example, an opening with a width of about 15 nm-100 nm) by a lithograph process including exposure and development, as shown in FIG. 1.

The semiconductor substrate 101 is made of one selected from a group consisting of Si, Ge, SiGe, GaAs, GaSb, AlAs, InAs, InP, GaN, SiC, InGaAs, InSb and InGaSb. In one example, the semiconductor layer 103 will form the semiconductor fin and decides the approximate height of the semiconductor fin. The process parameters for ion implantation and annealing may be controlled according to an actual requirement so as to control the depth and extending range of the well region 102. As a result, a semiconductor layer 103 with a desired thickness is obtained.

The first mask layer 104, the second mask layer 105 and the third mask layer 106 are made of a material with desired chemical and physical properties so as to obtain a desired etching selectivity in the etching step, and/or function as a stop layer in Chemical Mechanical Polishing (CMP), and/or further function as an insulating layer in the final semiconductor device. In addition, the first mask layer 104, the second mask layer 105 and the third mask layer 106 are formed by utilizing the same or different deposition process mentioned above according to the material used. In one example, the first mask layer 104 is a silicon oxide layer with a thickness of about 5-15 nm and formed by thermal oxidation. The second mask layer is an amorphous silicon layer with a thickness of about 50-200 nm and formed by sputtering. The third mask layer is a silicon nitride layer with a thickness of about 5-15 nm and formed by sputtering.

Figure 2:
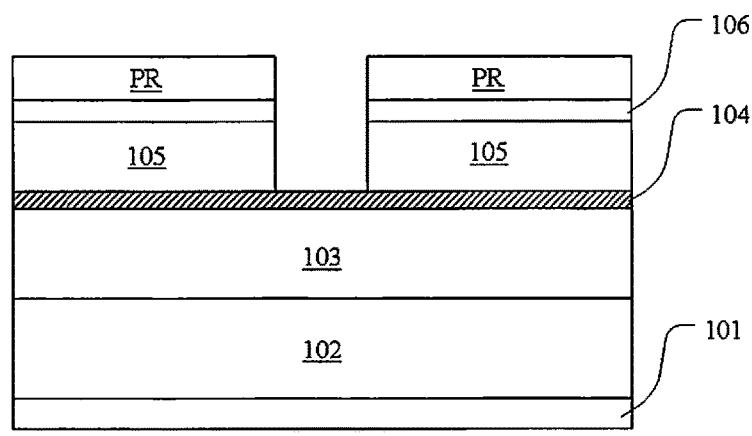

Afterwards, by utilizing the photoresist layer PR as a mask, the exposed portions of the third mask layer 106 and the second mask layer 105 are removed from the top down to form an opening by a dry etching such as ion beam milling etching, plasma etching, reactive ion etching, laser ablation, or by a wet etching using an etching agent solution, as shown in FIG. 2. Due to the etching selectivity or by controlling the etching time, the etching step is stopped at a top of the first mask layer. A plurality of etching steps may be used to etch different layers. In one example, the first etching step may utilize a reactive ion etching, by employing an appropriate etching agent to remove the exposed portion of the third mask layer 106 (for example, formed from silicon nitride) with respect to the second mask layer 105 (for example, formed from an amorphous silicon). The second etching step may utilize a reactive ion etching, by employing an appropriate etching agent, to remove the exposed portion of the second mask layer 105 (for example, formed from an amorphous silicon) with respect to the first mask layer 104 (for example, formed from silicon oxide).

Figure 3:
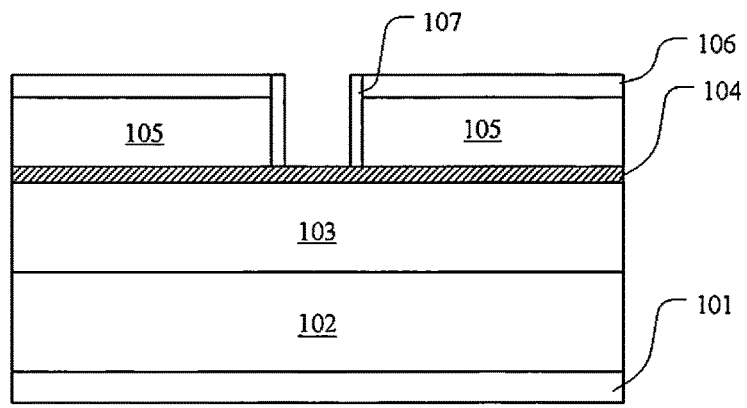

Afterwards, the photoresist layer PR is removed by dissolving in a solvent or by ashing. A conformal fourth mask layer 10 is formed on the semiconductor structure by a known deposition process. The portions of the fourth mask layer 107 laterally extending over the third mask layer 106 and at the bottom of the opening (i.e. on the first mask layer 104) are removed by an anisotropic etching process (for example, reactive ion etching) so that the portion of the fourth mask layer 107 within the inner walls of the opening remains and forms a spacer, as shown in FIG. 3. As described in the following, the fourth mask layer 107 is used to define the width of the semiconductor fin. The thickness of the fourth mask layer 107 may be controlled according to the desired width of the semiconductor fin. In one example, the fourth mask layer 107 is a silicon nitride layer with a thickness of about 3-28 nm and formed by Atom Layer Deposition.

Figure 4:
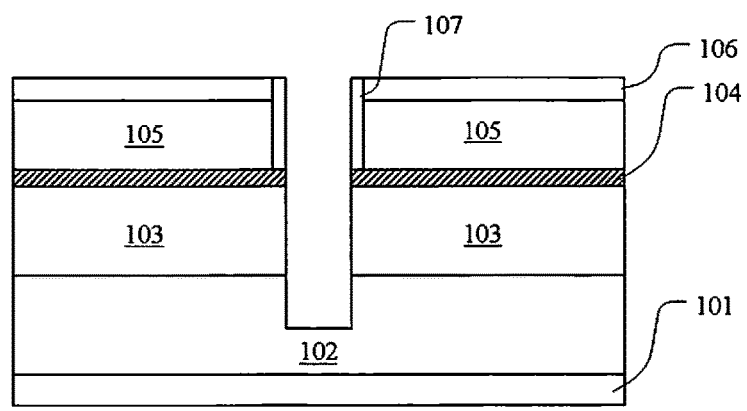

Afterwards, by utilizing the third mask 106 and the fourth mask 107 as a hard mask, the exposed portion of the first mask layer 104 is removed via the opening by the known etching process as mentioned above. In addition, the exposed portions of the semiconductor layer 103 and the well region 102 are further etched, until penetrating through the semiconductor layer 103 and arriving at a predefined depth in the well region 102, as shown in FIG. 4. The depth of the portion of opening within the well region 102 may be determined according to the design requirement and the depth of such a portion may be controlled by controlling the etching time. In one example, the depth of such a portion is about 10-30 nm, so that it is large enough to prevent the dopants in the well region 102 from diffusing into the semiconductor fin in the subsequent steps.

Figure 5:
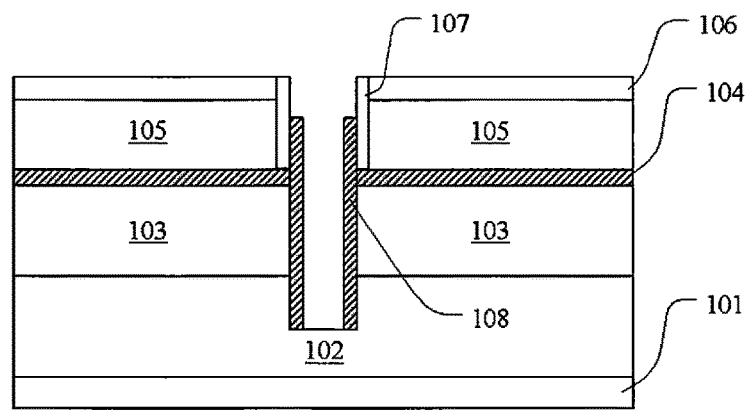

Afterwards, a conformal dielectric layer is formed on the surface of the semiconductor structure by a known deposition process as mentioned above. The portions of the dielectric layer laterally extending over the third mask layer 106 and at the bottom of the opening (i.e. on the exposed surface of the well region 102 within the opening) are removed by an anisotropic etching process (for example, reactive ion etching) so that the portion of the dielectric layer within the inner walls of the opening remains and forms a back gate dielectric 108 in the form of a spacer, as shown in FIG. 5. In place of the process of depositing a dielectric layer, a back gate dielectric 108 in the form of a spacer is formed on the sidewalls of the semiconductor layer 103 and the well region 102 within the opening, by thermal oxidation without the subsequent anisotropic etching, which may further simply the process. In one example, the back gate dielectric 108 is a silicon oxide layer with a thickness of about 10-30 nm.

Figure 6:
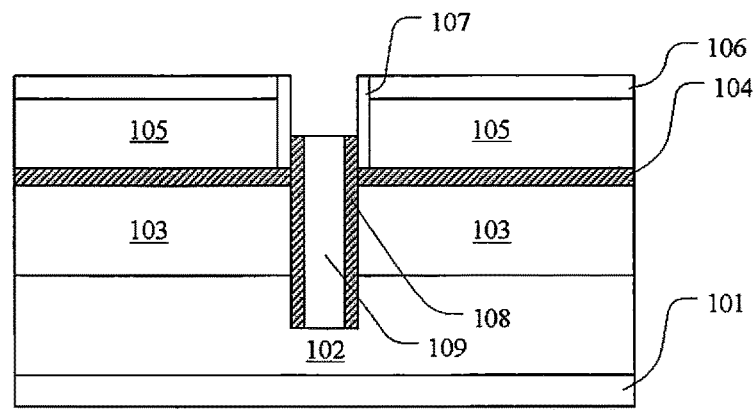

Afterwards, a conductor layer is formed on the surface of the semiconductor structure by a known deposition process as mentioned above. The conductor layer at least fills in the opening. The conductor layer is etched back to remove one portion of the conductor layer outside of the opening and to further remove one portion of the conductor layer within the opening so as to form a back gate conductor 109 within the opening, as shown in FIG. 6. The back gate conductor 109 is isolated from the semiconductor layer 103 by the back gate dielectric 108. The back gate conductor 109 is made of at least one selected from a group consisting of TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, W, HfRu, RuOx and doped poly silicon, or combinations thereof. In one example, the back gate conductor 109 is made of an N-type or P-type doped poly silicon with a doping concentration of $1 \times 10^{18}$ $cm^{-3}$- $1 \times 10^{21}$ $cm^{-3}$.

The step of etching back for forming the back gate conductor 109 results in the top of the back gate conductor 109 being below the back gate dielectric 108. Optionally, the back gate dielectric 108 is further selectively etched back with respect to the back gate conductor 109 so that the top of the back gate dielectric 108 is leveled with that of the back gate conductor 109.

Figure 7:
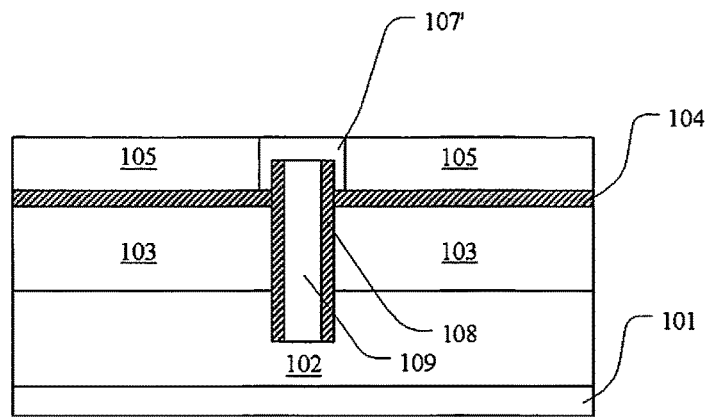

Afterwards, in a case where a mask is not used, the third mask layer 106 over the second mask layer 105 is selectively completely removed with respect to the second mask layer 105 so as to expose the surface of the second mask layer 105. In one example, in a case where the second mask layer 105 is formed from amorphous silicon and the third mask layer 106 is formed from silicon oxide, a hydrofluoric acid may be used as an etching agent to selectively remove the silicon oxide. An insulating layer is formed on the surface of the semiconductor structure by a known deposition process as mentioned above. The insulating layer at least fills in the opening so as to cover the top surface of the back gate conductor 109. The insulating layer is etched back to remove one portion, which is outside of the opening. In one example, the insulating layer is a silicon nitride layer formed by sputtering. The insulating layer and the fourth mask layer 107 together form an insulating cap 107', as shown in FIG. 7. Such an etching may further remove one portion of the insulating layer within the opening. The time for etching back is controlled so that the portion of the insulating layer within the opening covers the top of the back gate conductor 109 and provides a desired electrically-insulating characteristic.

Figure 8:
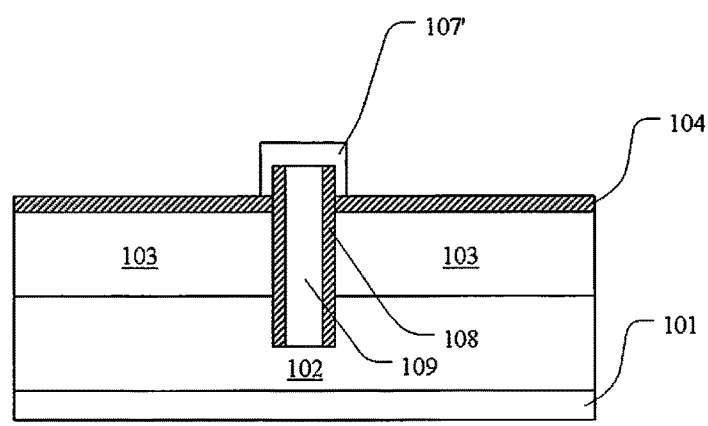

Afterwards, in a case where a mask is not used, the second mask layer 105 is selectively completely removed with respect to the insulating cap 107' and the first mask layer 104 by a known etching process as mentioned above so as to expose the surface of the first mask layer 104, as shown in FIG. 8. In one example, in a case where the first mask layer is formed from silicon oxide, the second mask layer 105 is formed from amorphous silicon and the insulating cap 107' is formed from silicon nitride, a Tetramethylammonium hydroxide Beilstein (TMAH) may be used as an etching agent to selectively remove the amorphous silicon.

Figure 9:
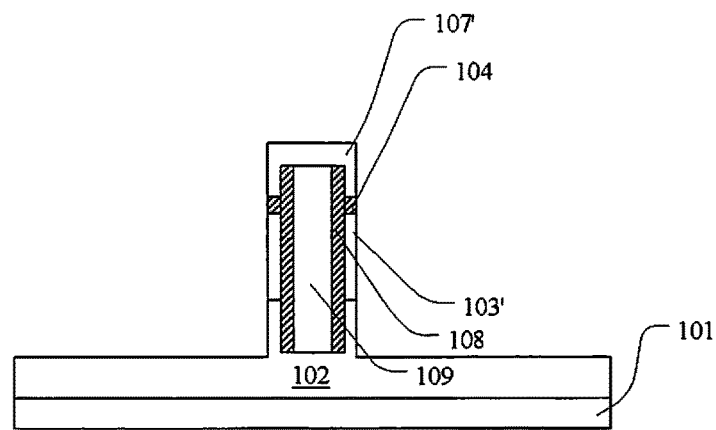

Afterwards, by taking the insulating cap 107' as a hard mask, the exposed portion of the semiconductor layer 103 is completely removed by a known etching process as mentioned above. In addition, the exposed portion of the well region 102 is further etched to a predefined depth, as shown in FIG. 9. Just as illustrated in the following, the well region 102 functions as a part of the conductive path of the back gate conductor. The depth for etching is controlled by controlling the etching time so that the well region 102 is maintained at a certain thickness so as to reduce the relevant parasitic resistance.

Such an etching patterns the semiconductor layer 103 to be two semiconductor fins 103' at the respective sides of the back gate conductor 109 and the back gate conductor 109 is isolated from the two semiconductor fins 103' by respective back gate dielectric 108, so as to form an interlayer structure of Fin-BackGate-Fin. The semiconductor fin 103 is a part of the original semiconductor substrate 101, so it is identically made of one selected from a group consisting of Si, Ge, SiGe, GaAs, GaSb, AlAs, InAs, InP, GaN, SiC, InGaAs, InSb and InGaSb. In the example shown in FIG. 9, the semiconductor fin 103' has a shape of a strip, the length of which is along a direction perpendicular to the paper plane, the width of which is along the transversal direction within the paper plane, and the height of which is along the vertical direction within the paper plane. The height of the semiconductor fin 103' is approximately determined by the thickness of the original semiconductor layer 103. The width of the semiconductor fin 103' is approximately determined by the thickness of the original fourth mask layer 107. The length of the semiconductor fin 103' may be defined by an additional etching step according to the design requirement. In the etching step and the subsequent process steps, the previously formed back gate conductor 109 provides mechanical support and protection for the semiconductor fin 103' so as to obtain a high rate of finished products.

Figure 10:
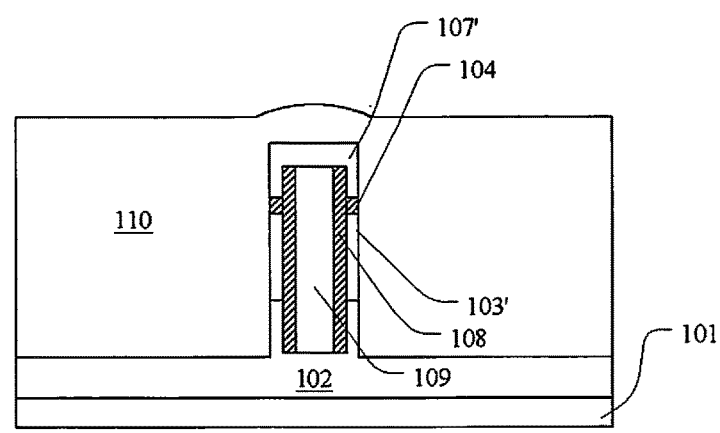

Afterwards, a first insulating layer 110 is formed on the surface of the semiconductor structure, as shown in FIG. 10. In one example, the first insulating layer 110 is formed of silicon oxide, for example, formed by sputtering. The thickness of the first insulating layer 110 is large enough to fill in the opening at the side of the semiconductor fin 103' formed in the step of etching for forming the semiconductor fin 103', and to cover the insulating cap 107'. If necessary, the surface of the first insulating layer 110 may be flattened by a further in-situ sputtering or an additional chemical mechanical polishing.

Afterwards, the first insulating layer 110 is etched back by a selective etching process (e.g., reactive ion etching). Such an etching not only removes the portion of the first insulating layer 110 on top of the insulating cap 107', but also reduces the thickness of the portion of the first insulating layer 110 within the opening on both sides of the semiconductor fin 103'. The etching time is controlled so that the surface of the first insulating layer 110 is higher than the top of the well region 102 and the side of the semiconductor fin 103' over the well region is exposed.

Figure 11:
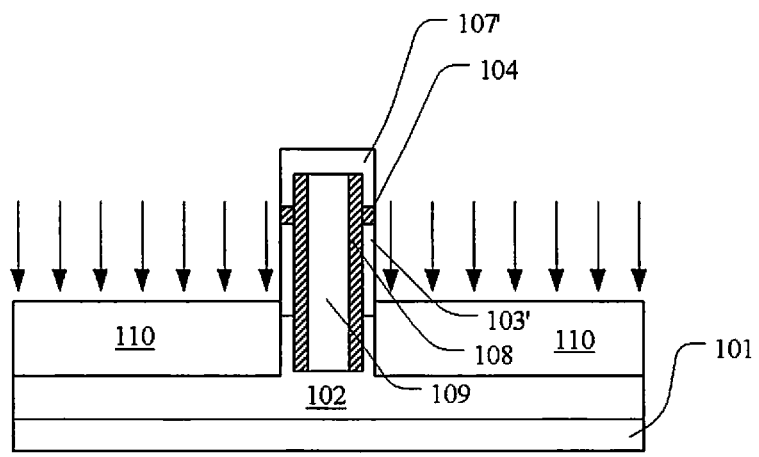
Figure 12:
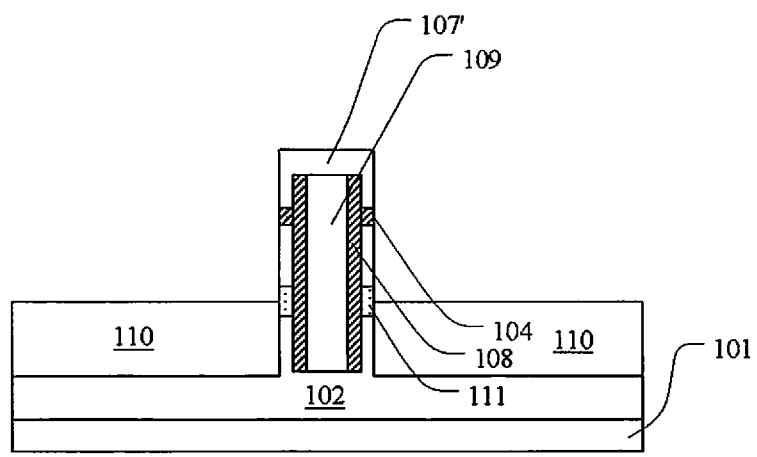
Figure 13:
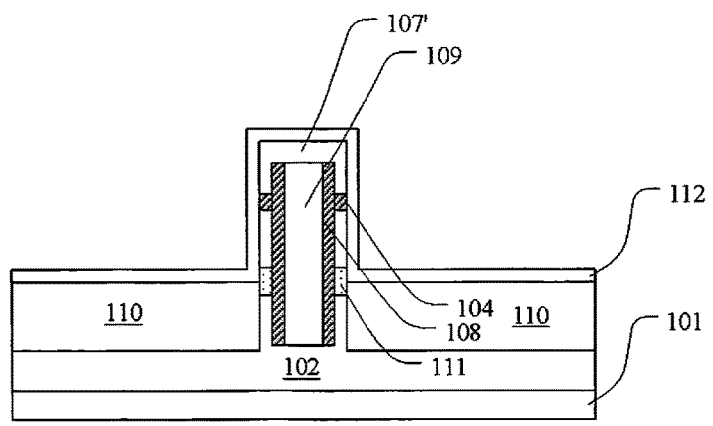

As an optional step, a dopant is implanted into the first insulating layer 110 by utilizing ion implantation, as shown in FIG. 11. Due to the ion scattering at the surface, the dopant may easily enter into the lower portion of the semiconductor fin 103' approximate to the surface of the first insulating layer 110, so that the lower portion of the semiconductor fin 103' forms a punch-through stop layer 111, as shown in FIG. 12. Alternatively, the dopant may be driven-into the semiconductor fin 103' from the first insulating layer 110 so as to form a punch-through stop layer 111 by utilizing an additional thermal annealing. The punch-through stop layer 111 may further comprise the portion of the well region 102 approximate to the surface of the first insulating layer 110.

Different dopants may be employed for different types of FETs. A P-type dopant such as B may be utilized in an N-type FET, and an N-type dopant such as P and As may be utilized in a P-type FET. As a result, the punch-through stop layer 111 isolates the semiconductor fin 103' from the well region 102 in the semiconductor substrate 101. Furthermore, the doping type of the punch-through stop layer 111 is opposite to those of the source region and the drain region and the doping concentration of the punch-through stop layer 111 is higher than the well region 102 in the semiconductor substrate 101. Although the well region 102 may turn off the leakage current path between the source region and the drain region, and plays a role of the punch-through stop layer to a certain extent, the additional heavily doped punch-through stop layer 112 below the semiconductor fin 103' may further improve the effect of suppressing leakage current between the source region and the drain region.

Afterwards, a front gate dielectric 112 (silicon oxide or silicon nitride) is formed on the surface of the semiconductor structure by a known deposition process as mentioned above, and as shown in FIG. 13. In one example, the front gate dielectric 112 is a silicon oxide layer with a thickness of about 0.8-1.5 nm. The front gate dielectric 112 covers one respective side surface of the two semiconductor fin 103'.

Afterwards, a front gate conductor 113 (for example, doped poly silicon) is formed on the surface of the semiconductor structure, as shown in FIG. 14. If necessary, the front gate conductor 113 may be processed by Chemical Mechanical Polish (CMP) to obtain a smooth surface.

Afterwards, by utilizing a photoresist mask, the conductor layer is patterned to be a front gate conductor 113 intersecting the semiconductor fin 103'. Then, the photoresist layer is removed by solving in a solvent solution or ashing. A nitride layer is formed on the surface of the semiconductor structure by a known deposition process as mentioned above. In one example, the nitride layer is a silicon nitride layer with a thickness of about 5-20 nm. By an anisotropic etching process (such as reactive ion etching), the portion of the nitride layer laterally extending is removed so that the vertical portion of the nitride layer on the side surface of the front gate conductor 113 reserves so as to form a gate spacer 114, as shown in FIGS. 15a, 15b, 15c and 15d.

Generally, due to the shape factor (for example, the thickness of the gate conductor layer (e.g., doped poly silicon)) is larger than twice a height of the fin, or a fin with a trapezoidal shape (the upper portion being wider than the lower one) may be utilized), the thickness of the nitride layer on the side surface of the semiconductor fin is smaller than that of the nitride layer on the side surface of the front gate conductor 113, such that the nitride layer on the side surface of the semiconductor fin 103' may be completely removed in this etching step. Otherwise, the nitride layer on the side surface of the semiconductor fin 103' would affect formation of the subsequent source/drain regions. The nitride layer on the side surface of the semiconductor fin 103' may be further removed by utilizing an additional mask.

The front gate conductor 113 and the front gate dielectric 112 together form a gate stack. In the examples shown in FIGS. 15*a*, 15*b*, 15*c* and 15*d*, the front gate conductor 113 has a shape of a strip and extends along a direction perpendicular to the length of the semiconductor fin.

In the subsequent steps, a source region and a drain region connected to the channel region provided by the semiconductor fin 103' are formed according to a conventional process by taking the front gate conductor 113 and the gate spacer 114 as a hard mask. In one example, the source region and the drain region may be the doping region formed by ion implantation or in-situ doping at the two ends of the semiconductor fin 103'. In another example, the source region and the drain region may be the doping region formed by ion implantation or in-situ doping in an additional semiconductor layer in contact with the two ends or side surface of the semiconductor fin 103.

Figure 16A:
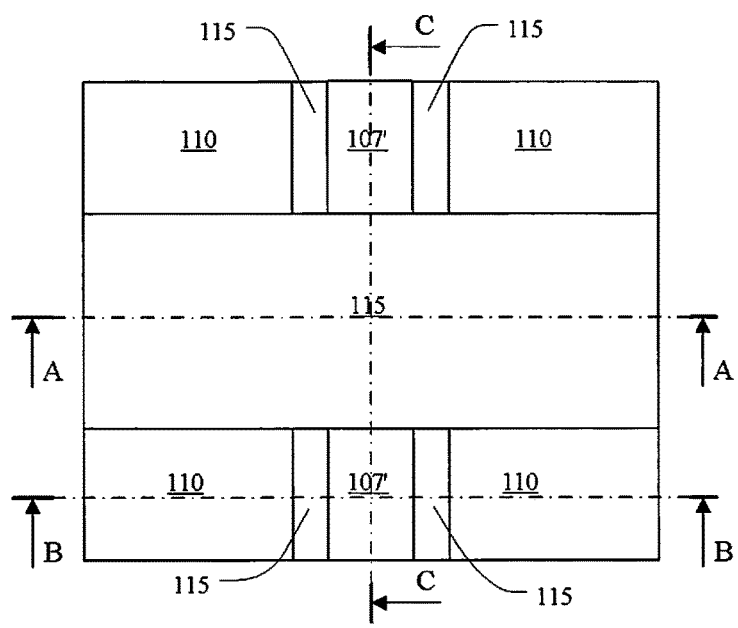
FIG. 16-FIG. 17 show schematic views of the semiconductor structure in some portions of stages of the method for manufacturing a semiconductor device according to one embodiment of the present disclosure.
Figure 16B:
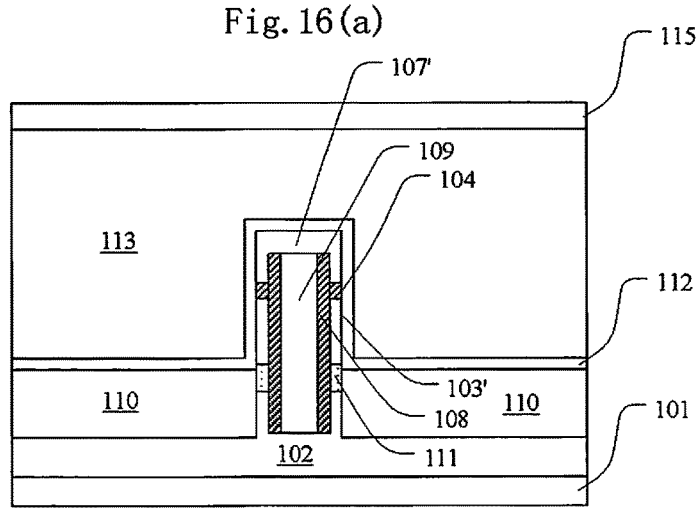
Figure 16C:
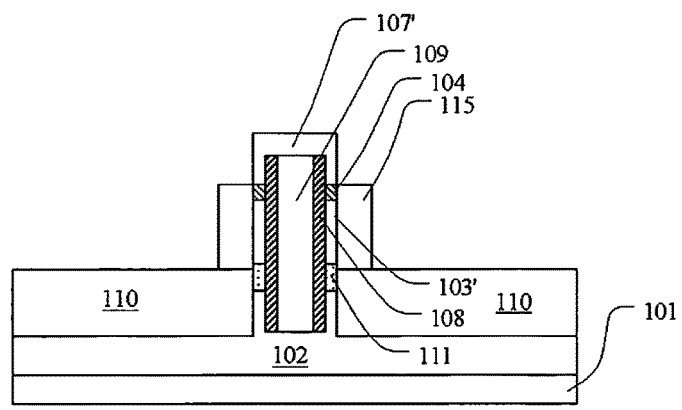
Figure 16D:
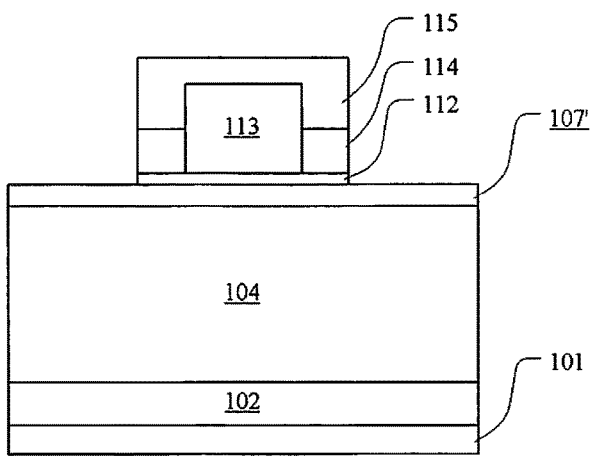
Figure 17A:
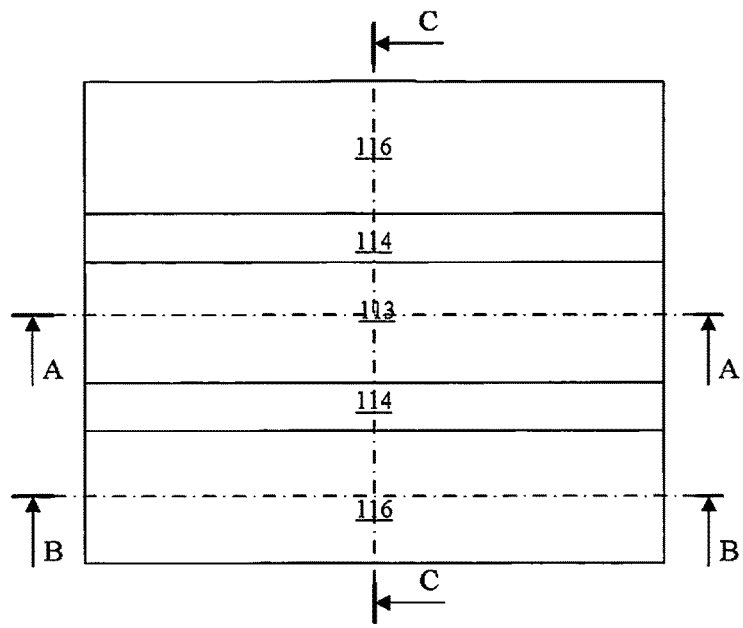
Figure 17B:
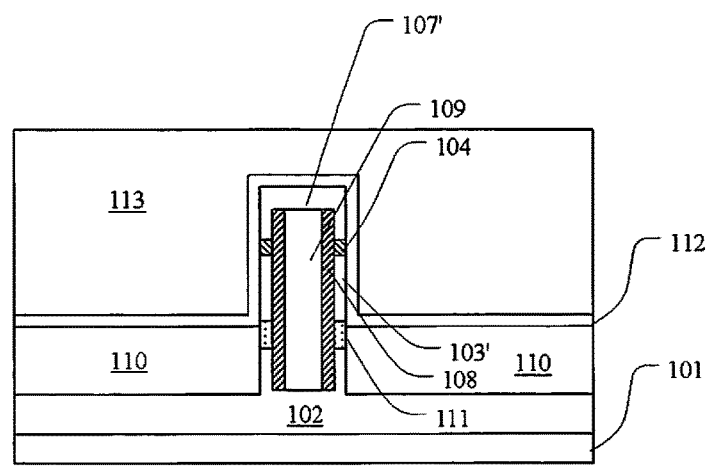
Figure 17C:
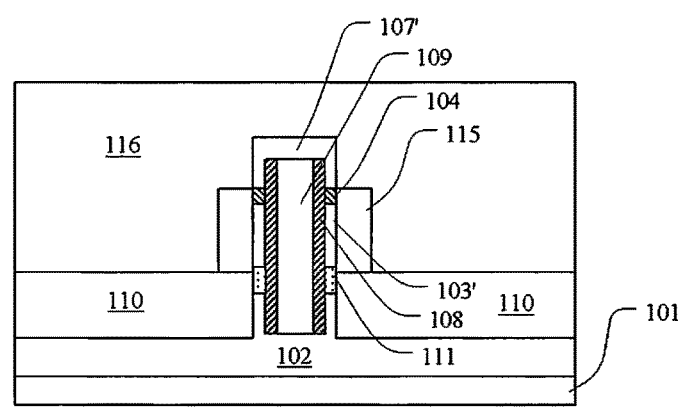
Figure 17D:
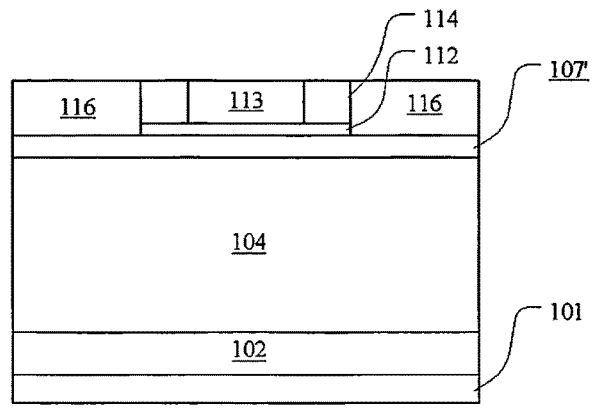

An exemplified flow chart of a part of stages of a method for manufacturing a semiconductor device according to one further preferred embodiment of the present disclosure is illustrated by referring to FIG. 16-FIG. 17, in which FIG. 16*a* and FIG. 17*a* show a top view of the semiconductor structure and position in a sectional view; FIG. 16*b* and FIG. 17*b* show a sectional view of the semiconductor structure along a line A-A in a widthwise direction of the semiconductor fin; FIG. 16*c* and FIG. 17*c* show a sectional view of the semiconductor structure along a line B-B in a widthwise direction of the semiconductor fin; and FIG. 16*d* and FIG. 17*d* show a sectional view of the semiconductor structure along a line C-C in a lengthwise direction of the semiconductor fin.

According to such a preferred embodiment, the steps as shown in FIGS. 16 and 17 are further implemented to form a stress application layer 115 after the step as shown in FIG. 15.

Afterwards, the stress application layer 115 is epitaxially grown on the exposed side surface of the semiconductor fin 103' by a known deposition process as mentioned above, and as shown in FIGS. 16*a*, 16*b*, 16*c* and 16*d*. The stress application layer 115 is further formed on the front gate conductor 113. The stress application layer 115 is thick enough to apply desired stress on the semiconductor fin 103'.

Different stress application layers 115 may be formed for different types of FinFETs. The carrier mobility is enhanced by applying appropriate stress to the channel region of the FinFET through the stress application layer 115, so as to reduce the on-resistance and increase the switching speed of the device. Thus, employing a semiconductor material different from that of the semiconductor fin 103' to form the stress application layer 115 may generate a desired stress. For an N-type FinFET, the stress application layer 115 is, for example, a Si:C layer with a carbon content of about 0.2-2 ato. % formed on a Si substrate, and applies a tensile stress to the channel region along the longitudinal direction of the channel region. For a P-type FinFET, the stress application layer 115 is, for example, a Si:Ge layer with a germanium content of about 15-75 ato. % formed on a Si substrate, and applies a compression stress to the channel region along the longitudinal direction of the channel region.

Afterwards, a second insulating layer 116 is formed on the surface of the semiconductor structure by a known deposition process as mentioned above. In one example, the second insulating layer 116 is a silicon oxide layer, and the thickness of the second insulating layer 116 is large enough to fill in the opening at the side of the semiconductor fin 103' formed in the step of etching for forming the semiconductor fin 103', and to cover the top surface of the front gate conductor 113. The second insulating layer 116 is processed by a Chemical Mechanical Polishing by taking the gate spacer 114 as a stop layer to obtain a smooth surface, as shown in FIGS. 17*a*, 17*b*, 17*c* and 17*d*. Such a Chemical Mechanical Polishing removes one portion of the stress application layer 115 over the front gate conductor 113 and exposes the top surface of the front gate conductor 113.

Furthermore, as mentioned above, a source region and a drain region connected to the channel region provided by the semiconductor fin 103' are formed according to a conventional process by taking the front gate conductor 113 and the gate spacer 114 as a hard mask in the subsequent steps. In one example, the source region and the drain region may be the doping region formed by ion implantation or in-situ doping at the two ends of the semiconductor fin 103'. In another example, the source region and the drain region may be the doping region formed by ion implantation or in-situ doping in an additional semiconductor layer in contact with the two ends or side surface of the semiconductor fin 103.

Figure 18A:
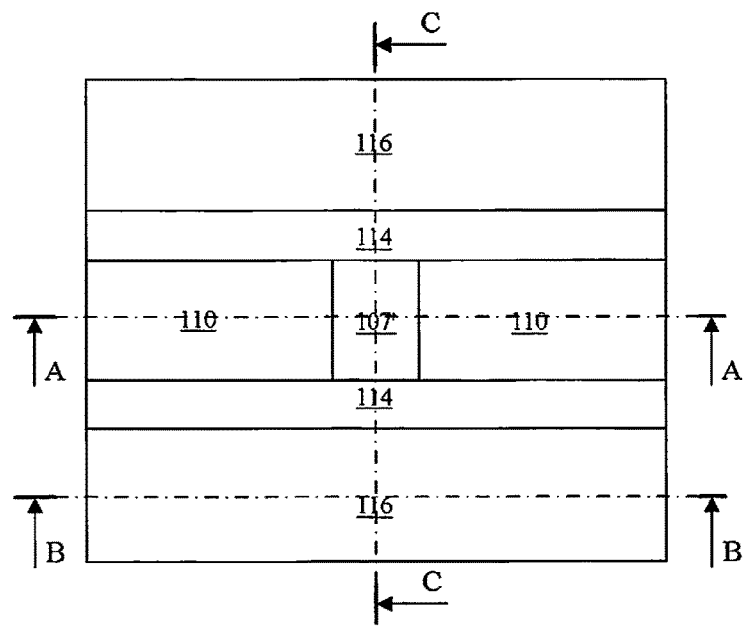
FIG. 18-FIG. 19 show schematic views of the semiconductor structure in some portions of stages of the method for manufacturing a semiconductor device according to one embodiment of the present disclosure.
Figure 18B:
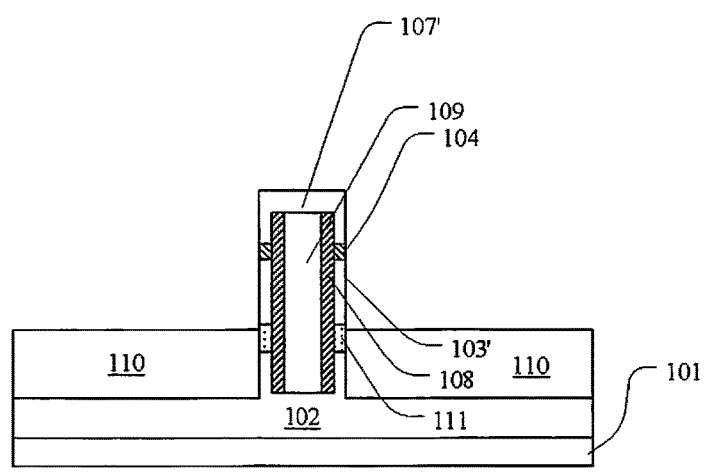
Figure 18C:
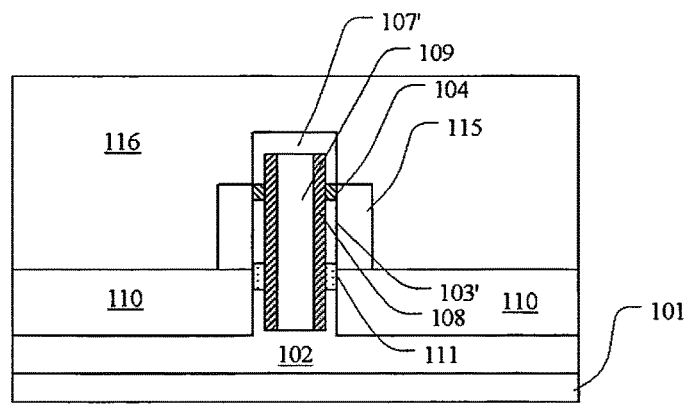
Figure 18D:
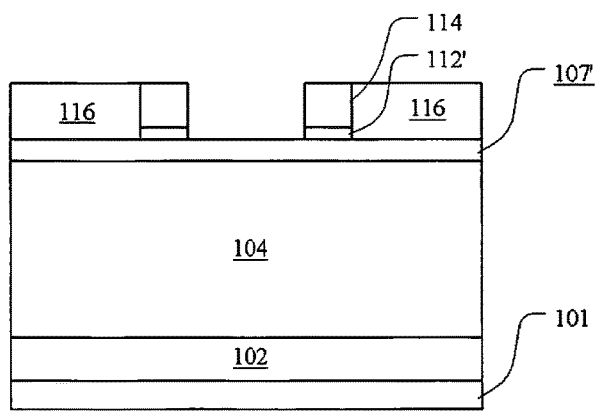
Figure 19A:
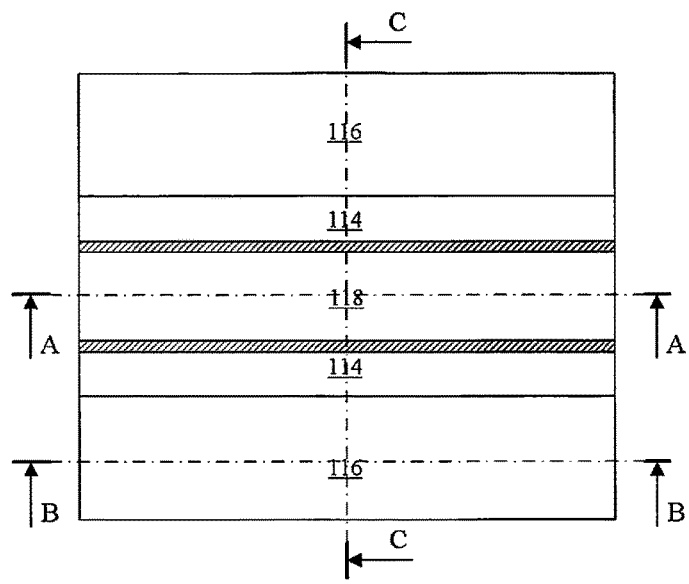
Figure 19B:
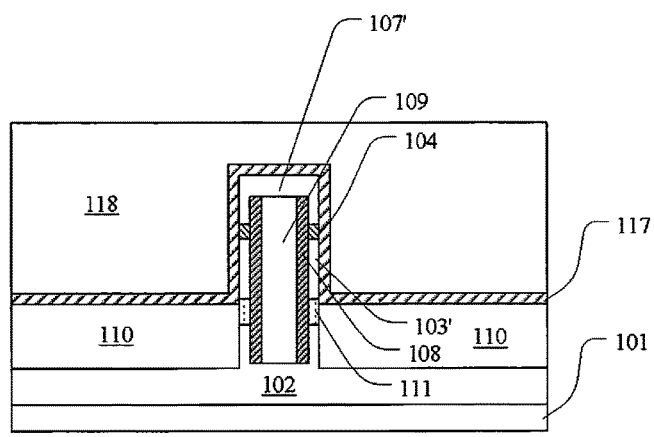
Figure 19C:
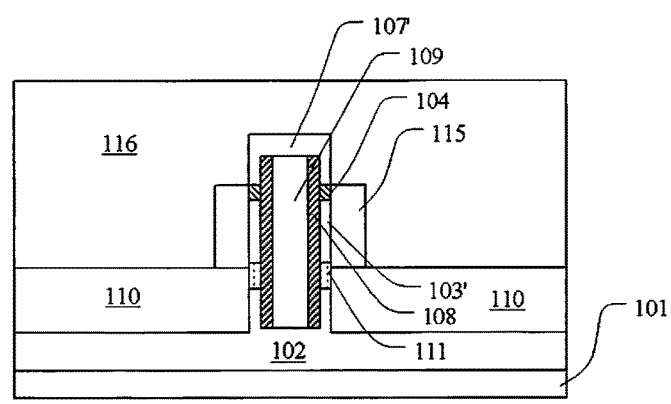
Figure 19D:
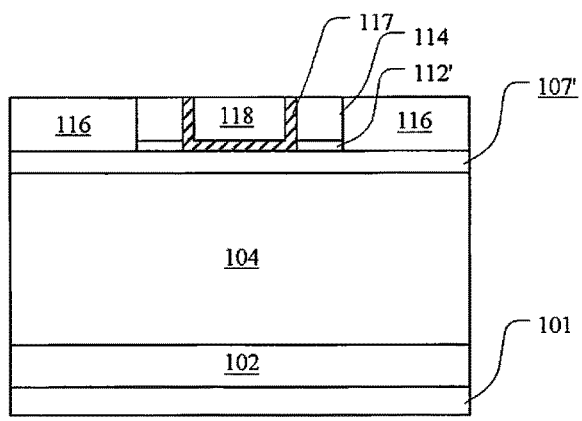

An exemplified flow chart of a part of stages of a method for manufacturing a semiconductor device according to one further preferred embodiment of the present disclosure is illustrated by referring to FIGS. 18-FIG. 19, in which FIG. 18*a* and FIG. 19*a* show a top view of the semiconductor structure and position for a sectional view; FIG. 18*b* and FIG. 19*b* show a sectional view of the semiconductor structure along a line A-A in a widthwise direction of the semiconductor fin; FIG. 18*c* and FIG. 19*c* show a sectional view of the semiconductor structure along a line B-B in a widthwise direction of the semiconductor fin; and FIG. 18*d* and FIG. 19*d* show a sectional view of the semiconductor structure along a line C-C in a lengthwise direction of the semiconductor fin.

According to such a preferred embodiment, a sacrificial gate conductor 113' and a sacrificial gate dielectric 112' are formed in the step shown in FIG. 15, and a stress application layer 115 is formed after the step shown in FIG. 17. The source region and the drain region have been formed, and the steps shown in FIG. 18 and FIG. 19 are further implemented to replace a sacrificial gate stack including a sacrificial gate conductor 113' and a sacrificial gate dielectric 112' with a replacement gate stack including a replacement gate conductor and a replacement gate dielectric.

By taking the second insulating layer 116 and the gate spacer 114 as a hard mask, the sacrificial gate conductor 113' is removed by a known etching process as mentioned above (e.g. reactive ion etching) so as to form a gate opening, as shown in FIGS. 18*a*, 18*b*, 18*c* and 18*d*. Optionally, one portion of the sacrificial gate dielectric 112' at bottom of the gate opening is further removed. According to a gate-last process, a replacement gate dielectric 117 and a replacement gate conductor 118 are formed in the gate opening, as shown in FIGS. 19*a*, 19*b*, 19*c* and 19*d*. The replacement gate conductor 118 and the replacement gate dielectric 117 together form the replacement gate stack. In one example, the replacement gate dielectric 117 is an $HfO_2$ layer with a thickness of about 0.3-1.2 nm, and the replacement gate conductor 118 is a TiN layer, for example.

According to various embodiments mentioned above, after the source region and the drain region are formed, an interlayer insulating layer, a plug in the interlayer insulating layer and wiring or electrodes on the top surface of the interlayer insulating layer are formed on the resultant semiconductor structure, so as to accomplish the other portions of the semiconductor device.

Figure 20:
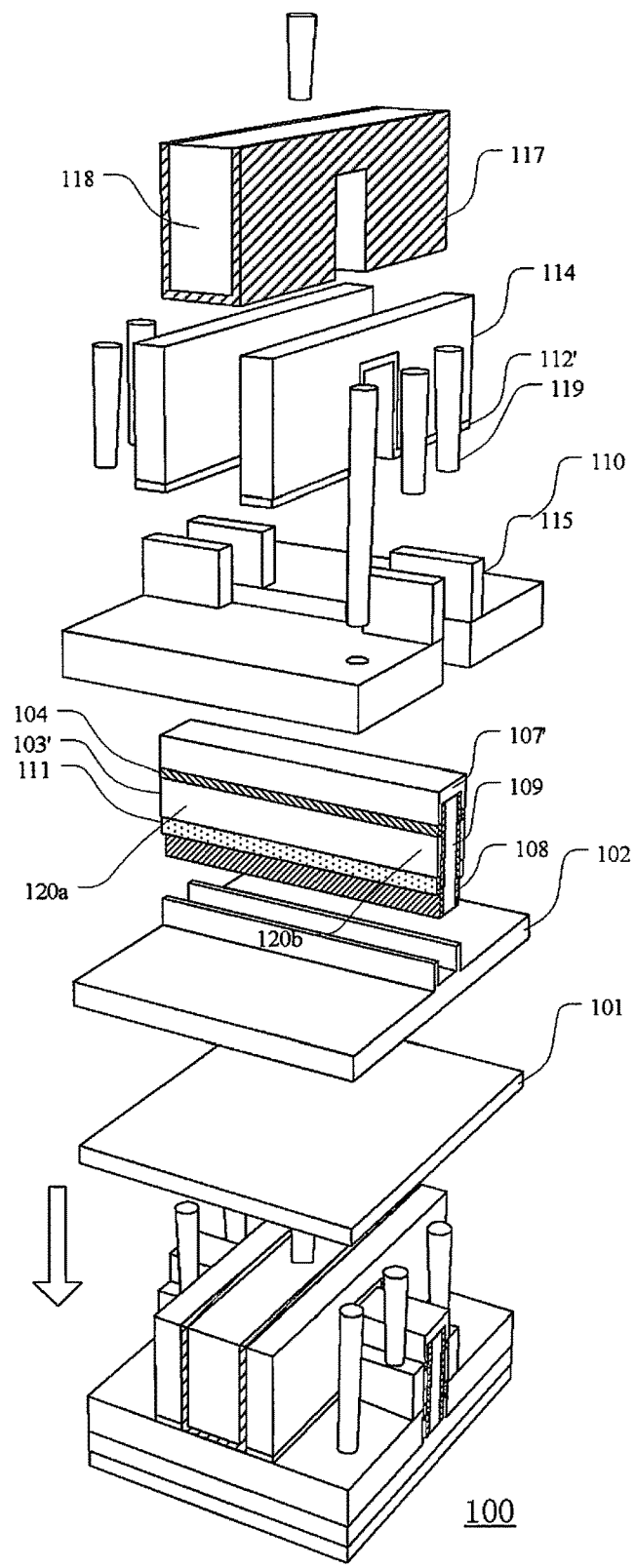
FIG. 20 is an exploded perspective view of the semiconductor device according to one embodiment of the present disclosure.

FIG. 20 shows an exploded perspective view of the semiconductor device 100 according to one preferred embodiment of the present disclosure, in which the second insulating layer 116 is not shown for clarity. The semiconductor device 100 is formed by employing the steps shown in FIGS. 1-19, so it comprises a plurality of preferred aspects of the present invention and should not be interpreted to limit the present invention to the combination of the plurality of preferred aspects of the present invention. Furthermore, the material mentioned above in this context is not repeated for brevity.

The semiconductor device comprises a semiconductor substrate 101, a well region 102 in the semiconductor substrate 101 and an interlayer structure over the well region 102. The interlayer structure includes a back gate conductor 109, two semiconductor fins 103' at both sides of the back gate conductor 109 and respective back gate dielectric layers 108 isolating the back gate conductor 109 from the two semiconductor fins 103'. The well region 102 functions as one portion of a conductive path of the back gate conductor 109. A punch-through stop layer 111 is at lower portion of the semiconductor fin 103'. A front gate stack intersects the semiconductor fin 103, and the front gate stack 103' includes a front gate dielectric and a front gate conductor. The front gate dielectric isolates the front gate conductor from the semiconductor fin 103'.

In the example shown in FIG. 20, the front gate dielectric is a replacement gate dielectric 117 formed by a gate-last process, and the front gate conductor is a replacement gate conductor 118 formed by a gate-last process. The gate spacer 114 is on a side surface of the replacement gate conductor 118. During the gate-last process, although the portion of the sacrificial gate dielectric 112' within the gate opening is removed, the portion of the sacrificial gate dielectric below the gate spacer 114 is reserved.

In addition, the insulating cap 107' is over the back gate conductor 109 and isolates the back gate conductor 109 from the replacement gate conductor 118. The first insulating layer 110 is between the replacement gate dielectric 117 and the well region 102, and isolates the replacement gate dielectric 117 from the well region 102.

The semiconductor device 100 further comprises a source region 120a and a drain region 120b connected to the channel region provided by the semiconductor fin 103'. In the example shown in FIG. 20, the source region 120a and the drain region 120b may be the doping region formed by ion implantation or in-situ doping at the two ends of the semiconductor fin 103'. The additional stress application layer 115 contacts the side surface of the semiconductor fin 103'. Four plugs 119 penetrate through the interlayer insulating layer to connect to the source region and the drain region of the two semiconductor fin 103', respectively. One additional plug 119 is connected to the replacement gate conductor 118, and another additional plug 119 penetrates through the interlayer insulating layer and the first insulating layer 110 to be connected to the well region, so as to be connected to the back gate conductor 109 via the well region.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

I claim:

1. A semiconductor device, comprising:
   a semiconductor substrate;
   a well region in the semiconductor substrate;
   an interlayer structure over the well region, the interlayer structure including a back gate conductor having a top surface, semiconductor fins at both sides of the back gate conductor and a respective back gate dielectric having a top surface, the back gate dielectric isolating the back gate conductor from the semiconductor fins, respectively, wherein the well region functions as one portion of a conductive path of the back gate conductor, and wherein the back gate conductor and the back gate dielectric are embedded into the well region at a predefined depth and the top surface of the back gate conductor and the top surface of the back gate dielectric are flush with each other;
   a front gate stack intersecting the semiconductor fins, the front gate stack including a front gate dielectric and a front gate conductor, and the front gate dielectric isolating the front gate conductor from the semiconductor fins;
   an insulating cap over the back gate conductor and the semiconductor fins, the insulating cap isolating the back gate conductor from the front gate conductor, wherein the insulating cap covers the flushed top surface of the back gate conductor and the top surface of the back gate dielectric and portions of sidewalls of the back gate dielectric, and the insulating cap contacts portions of the sidewalls of the back gate dielectric; and
   a source region and a drain region connected to a channel region provided by the semiconductor fins.

2. The semiconductor device according to claim 1, further comprising a punch-through stop layer at a lower portion of the semiconductor fins.

3. The semiconductor device according to claim 2, wherein the semiconductor device is N-type and the punch-through stop layer and the well region is P-type.

4. The semiconductor device according to claim 2, wherein the semiconductor device is P-type and the punch-through stop layer and the well region is N-type.

5. The semiconductor device according to claim 1, wherein the source region and the drain region are portions at two ends of the semiconductor fins.

6. The semiconductor device according to claim 1, wherein the source region and the drain region are doping regions in an additional semiconductor layer in contact with two ends of the semiconductor fins.

7. The semiconductor device according to claim 1, wherein the source region and the drain region are doping regions in an additional semiconductor layer in contact with a side surface of the semiconductor fins.

8. The semiconductor device according to claim 7, wherein the source region and the drain region are formed from a material different from that of the semiconductor fins.

9. The semiconductor device according to claim 1, further comprising an additional stress application layer in contact with a side surface of the semiconductor fin.

10. The semiconductor device according to claim 1, wherein the back gate conductor is made of at least one selected from a group consisting of TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, W, HfRu, RuOx, and doped poly silicon, or combinations thereof.

11. The semiconductor device according to claim 1, wherein the semiconductor fin is made of one selected from a group consisting of Si, Ge, SiGe, GaAs, GaSb, AlAs, InAs, InP, GaN, SiC, InGaAs, InSb and InGaSb.

12. A method for manufacturing a semiconductor device, comprising:
   forming a well region in a semiconductor substrate so that a portion of the semiconductor substrate over the well region forms a semiconductor layer;
   forming a plurality of mask layers on the semiconductor layer;
   forming an opening on a top one of the plurality of mask layers;
   forming another mask layer in a form of a spacer on an inner wall of the opening;
   penetrating the opening through the plurality of mask layers and the semiconductor layer to extend into the well region at a predefined depth by utilizing the other mask layer as a hard mask;
   forming a back gate dielectric in the inner wall of the opening;
   forming a back gate conductor in the opening, wherein the back gate conductor and the back gate dielectric are embedded into the well region at a predefined depth and a top surface of the back gate conductor is flush with a top surface of the back gate dielectric;
   forming an insulating cap including the other mask layer in the opening, the insulating cap covering the flushed top surface of the back gate dielectric and the top surface of the back gate conductor and portions of sidewalls of the back gate dielectric, and the insulating cap contacting portions of the sidewalls of the back gate dielectric;
   patterning the semiconductor layer into semiconductor fins by utilizing the insulating cap as a hard mask;
   forming a front gate stack intersecting the semiconductor fin, the front gate stack including a front gate dielectric and a front gate conductor, and the front gate dielectric isolating the front gate conductor from the semiconductor fin; and
   forming a source region and a drain region connected to a channel region provided by the semiconductor fin,
   wherein the back gate conductor, the semiconductor fins formed from the semiconductor layer at both sides of the back gate conductor, as well as the respective back gate dielectric separately isolating the back gate conductor from the semiconductor fins forming an interlayer structure,
   the insulating cap isolating the back gate conductor from the front gate conductor,
   and the well region functioning as one portion of a conductive path of the back gate conductor.

13. The method according to claim 12, further comprising a step of forming a punch-through stop layer at a lower portion of the semiconductor fins between the step of patterning the semiconductor layer and the step of forming the front gate stack.

14. The method according to claim 13, wherein the step of forming a punch-through stop layer comprises implementing an ion implantation to introduce a dopant into a portion of the semiconductor fins adjacent to the well region.

15. The method according to claim 14, wherein the step of forming a punch-through stop layer comprises forming an insulating layer to define the portions of the punch-through stop layer prior to the step of ion implantation.

16. The method according to claim 14, wherein the semiconductor device is N-type, a P-type dopant is used in the step of forming the well region and a P-type dopant is used in the step of forming the punch-through stop layer.

17. The method according to claim 14, wherein the semiconductor device is P-type, an N-type dopant is used in the step of forming the well region and an N-type dopant is used in the step of forming the punch-through stop layer.

18. The method according to claim 12, wherein the step of forming the source region and the drain region comprises implementing ion implantation into portions at two ends of the semiconductor fins.

19. The method according to claim 12, wherein the step of forming the source region and the drain region comprises forming an additional semiconductor layer in contact with two ends of the semiconductor fins and implementing ion implantation or in situ doping to the additional semiconductor layer.

20. The method according to claim 12, wherein the step of forming the source region and the drain region comprises forming an additional semiconductor layer in contact with the side surface of the semiconductor fins and implementing ion implantation or in situ doping to the additional semiconductor layer.

21. The method according to claim 12, further comprising epitaxially growing a stress application layer on side surface of the semiconductor fin.

22. The method according to claim 12, wherein the back gate conductor is made of at least one selected from a group consisting of TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, W, HfRu, RuOx, and doped poly silicon, or combinations thereof.

23. The method according to claim 12, wherein the semiconductor fin is made of one selected from a group consisting of Si, Ge, SiGe, GaAs, GaSb, AlAs, InAs, InP, GaN, SiC, InGaAs, InSb and InGaSb, or combinations thereof.

* * * * *